United States Patent
Parkhe et al.

(10) Patent No.: US 12,334,315 B2
(45) Date of Patent: Jun. 17, 2025

(54) COOLED SUBSTRATE SUPPORT ASSEMBLY FOR RADIO FREQUENCY ENVIRONMENTS

(71) Applicant: Applied Materials, Inc., Santa Clara, CA (US)

(72) Inventors: Vijay D. Parkhe, San Jose, CA (US); Andreas Schmid, Meyriez (CH); Andrew Antoine Noujaim, Morgan Hill, CA (US); Stephen Donald Prouty, San Jose, CA (US); Alvaro Garcia De Gorordo, San Francisco, CA (US); Martin Perez-Guzman, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 306 days.

(21) Appl. No.: 16/863,719

(22) Filed: Apr. 30, 2020

(65) Prior Publication Data

US 2021/0343512 A1   Nov. 4, 2021

(51) Int. Cl.
*H01J 37/32* (2006.01)
*C23C 16/458* (2006.01)
(Continued)

(52) U.S. Cl.
CPC .... *H01J 37/32724* (2013.01); *C23C 16/4586* (2013.01); *H01L 21/68785* (2013.01);
(Continued)

(58) Field of Classification Search
CPC . H01J 37/32082–3211; H01J 37/32183; H01J 37/32431–3244; H01J 37/32458;
(Continued)

(56) References Cited

U.S. PATENT DOCUMENTS 5,376,213 A * 12/1994 Ueda ................. H01L 21/67126
                                                  156/345.53
5,522,937 A *  6/1996 Chew ................ H01L 21/68764
                                                  118/500
(Continued)

FOREIGN PATENT DOCUMENTS

JP         06181186 A    6/1994
JP      2012142413 A    7/2012
(Continued)

OTHER PUBLICATIONS

"Apex Fasteners: Spring Washers" (Waybackmachine archive captured 2015).*
(Continued)

*Primary Examiner* — Kurt Sweely
(74) *Attorney, Agent, or Firm* — Patterson + Sheridan, LLP

(57) ABSTRACT

A substrate support assembly is described herein that includes a facility plate, a ground plate coupled to the facility plate, a fluid conduit disposed within the substrate support assembly disposed through the facility plate and the ground plate, and a connector coupled to the ground plate that houses a portion of the fluid conduit. The connector includes a biasing assembly and a fastener disposed in a pocket formed in the ground plate.

17 Claims, 6 Drawing Sheets

(51) Int. Cl.
*H01L 21/683* (2006.01)
*H01L 21/687* (2006.01)

(52) U.S. Cl.
CPC ....... *H01J 37/321* (2013.01); *H01J 37/32577* (2013.01); *H01L 21/6831* (2013.01)

(58) Field of Classification Search
CPC .......... H01J 37/32513; H01J 37/32522; H01J 37/32532–32577; H01J 37/32605; H01J 37/32697–32724; C23C 16/458–4583; C23C 16/4585–4586; C23C 16/46; C23C 16/463; C23C 16/505; H01L 21/67063–67069; H01L 21/68714; H01L 21/68735; H01L 21/68757; H01L 21/68785; H01L 21/68792; H01L 21/6831; C30B 25/08; C30B 25/12
See application file for complete search history.

(56) References Cited

U.S. PATENT DOCUMENTS

| | | | |
|---|---|---|---|
| 5,880,924 A * | 3/1999 | Kumar | H01L 21/6831 279/128 |
| 6,022,418 A * | 2/2000 | Iwabuchi | C23C 16/458 156/345.52 |
| 6,138,745 A * | 10/2000 | Moslehi | H01L 21/68785 118/728 |
| 6,296,255 B1 * | 10/2001 | Hashimoto | H01L 21/67126 277/927 |
| 6,558,508 B1 | 5/2003 | Kawakami | |
| 6,949,722 B2 | 9/2005 | Strang et al. | |
| 7,025,863 B2 * | 4/2006 | Seeli | C23C 14/505 118/723 MP |
| 7,161,121 B1 | 1/2007 | Steger | |
| 7,230,204 B2 | 6/2007 | Mitrovic et al. | |
| 7,651,583 B2 | 1/2010 | Kent et al. | |
| 8,007,591 B2 | 8/2011 | Hamelin | |
| 9,779,955 B2 | 10/2017 | Lill et al. | |
| 10,283,398 B2 | 5/2019 | Tanaka et al. | |
| 2002/0014894 A1 | 2/2002 | Yonezawa et al. | |
| 2005/0172903 A1 * | 8/2005 | Morita | H01J 37/32458 118/723 MW |
| 2006/0027169 A1 * | 2/2006 | Tsukamoto | C23C 16/46 118/724 |
| 2008/0217293 A1 | 9/2008 | Iimuro | |
| 2010/0122774 A1 | 5/2010 | Makabe et al. | |
| 2013/0001899 A1 | 1/2013 | Hwang et al. | |
| 2017/0372911 A1 | 12/2017 | Lill et al. | |
| 2018/0076048 A1 | 3/2018 | Gohira et al. | |
| 2018/0151402 A1 * | 5/2018 | Noorbakhsh | H01L 21/68785 |
| 2018/0197761 A1 | 7/2018 | Ferrara et al. | |
| 2018/0211822 A1 | 7/2018 | Gohira et al. | |
| 2018/0211924 A1 | 7/2018 | Andry et al. | |
| 2018/0350561 A1 | 12/2018 | Yamaguchi et al. | |
| 2019/0027345 A1 | 1/2019 | Ishikawa et al. | |
| 2019/0035609 A1 | 1/2019 | Tobe | |

FOREIGN PATENT DOCUMENTS

| | | |
|---|---|---|
| JP | 2014521213 A | 8/2014 |
| JP | 2016187056 A | 10/2016 |
| KR | 100233210 B1 | 12/1999 |
| KR | 101132632 B1 | 4/2012 |

OTHER PUBLICATIONS

International Search Report and Written Opinion in related application PCT/US2020/065708 dated Apr. 21, 2021.
Taiwan Office Action for Application No. 109145235 dated Oct. 20, 2023.
Office Action for Application No. 2022-566350 dated Jan. 30, 2024.
Korean Office Action for Application No. 10-2022-7041742 dated Apr. 23, 2024.

* cited by examiner

COOLED SUBSTRATE SUPPORT ASSEMBLY FOR RADIO FREQUENCY ENVIRONMENTS

BACKGROUND

Field

Embodiments of the present disclosure generally relate to semiconductor chamber components, and more particularly to a cooled substrate support assembly for use in high frequency electric fields.

Description of the Related Art

Reliably producing nanometer and smaller features is one of the key technology challenges for next generation very large scale integration (VLSI) and ultra-large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to VLSI and ULSI success and to the continued effort to increase circuit density and quality of individual substrates and die.

To drive down manufacturing cost, integrated chip (IC) manufacturers demand higher throughput and better device yield and performance from every silicon substrate processed. Some fabrication techniques being explored for next generation devices under current development require processing at cryogenic temperatures. Dry reactive ion etching a substrate uniformly maintained at a cryogenic temperature enables ions to bombard the upward facing surfaces of materials disposed on the substrate with decreased spontaneous etching so that trenches with smooth, vertical sidewalls are formed. Additionally, selectivity of etching one material versus another can be improved at the cryogenic temperature. For example, selectivity between silicon (Si) and silicon dioxide ($SiO_2$) increases exponentially as temperature is decreased.

Operating a substrate support assembly to enable cryogenic temperature processing often relies on the use of coolants circulated through the substrate support assembly. As the conduits used to route the coolant span portions of the substrate support assembly that are both grounded and powered, the coolants and conduits must be sufficiently electrically insulative to prevent shorting. However, the flow of coolant within the insulative conduits can cause charge build up on the tubing over time that is sufficient to cause arcing between the conduit and grounded portions of the substrate support assembly. Further, cooling and heating of the substrate support assembly causes expansion and contraction that may cause leakage at the conduits. Arcing and/or coolant leakage may cause or contribute to many problems.

Thus, there is a need for an improved substrate support assembly.

SUMMARY

Substrate support assemblies are described herein that include one or more fluid conduits for carrying a fluid at cryogenic temperatures. The fluid conduits are configured to reduce arcing.

In one embodiment, a substrate support assembly is described herein that includes a facility plate, a ground plate coupled to the facility plate, a fluid conduit disposed within the substrate support assembly disposed through the facility plate and the ground plate, and a connector coupled to the ground plate that houses a portion of the fluid conduit. The connector comprises a biasing assembly and a fastener disposed in a pocket formed in the ground plate.

In another embodiment, a substrate support assembly is described that includes a base assembly for supporting an electrostatic chuck, a facility plate coupled to the base assembly, a dielectric plate coupled to the facility plate, a ground plate coupled to the facility plate, a fluid conduit disposed within the substrate support assembly disposed through the facility plate and the ground plate, and a connector coupled to the ground plate that houses a portion of the fluid conduit. The connector comprises a biasing assembly and a fastener disposed in a pocket formed in the ground plate. A sliding seal surrounds a body of the connector.

In another embodiment, a substrate support assembly is described herein that includes an electrostatic chuck, a base assembly coupled to the electrostatic chuck, a facility plate coupled to the base assembly, a dielectric plate coupled to the facility plate, a ground plate coupled to the facility plate, a fluid conduit disposed within the substrate support assembly disposed through the facility plate and the ground plate, and a connector coupled to the ground plate that houses a portion of the fluid conduit. The connector comprises a biasing assembly and a fastener disposed in a pocket formed in the ground plate. A sliding seal surrounds a body of the connector.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein provide a substrate support assembly which enables a cryogenic temperature operation of an electrostatic chuck (ESC) so that a substrate disposed thereon is maintained at a cryogenic processing temperature suitable for processing while other surfaces of a processing chamber are maintained at a different temperature. The cryogenic processing temperature (i.e., temperature of the substrate) is intended to refer to temperatures less than −10 degrees Celsius at the substrate support.

Although the substrate support assembly is described below in an etch processing chamber, the substrate support assembly may be utilized in other types of plasma processing chambers, such as physical vapor deposition chambers, chemical vapor deposition chambers, ion implantation chambers, among others, and other systems where processing a substrate maintained at the cryogenic processing temperature is desirable. It is to be noted however, that the substrate support assemblies and chamber components described herein may be utilized at other processing temperatures.

Figure 1:
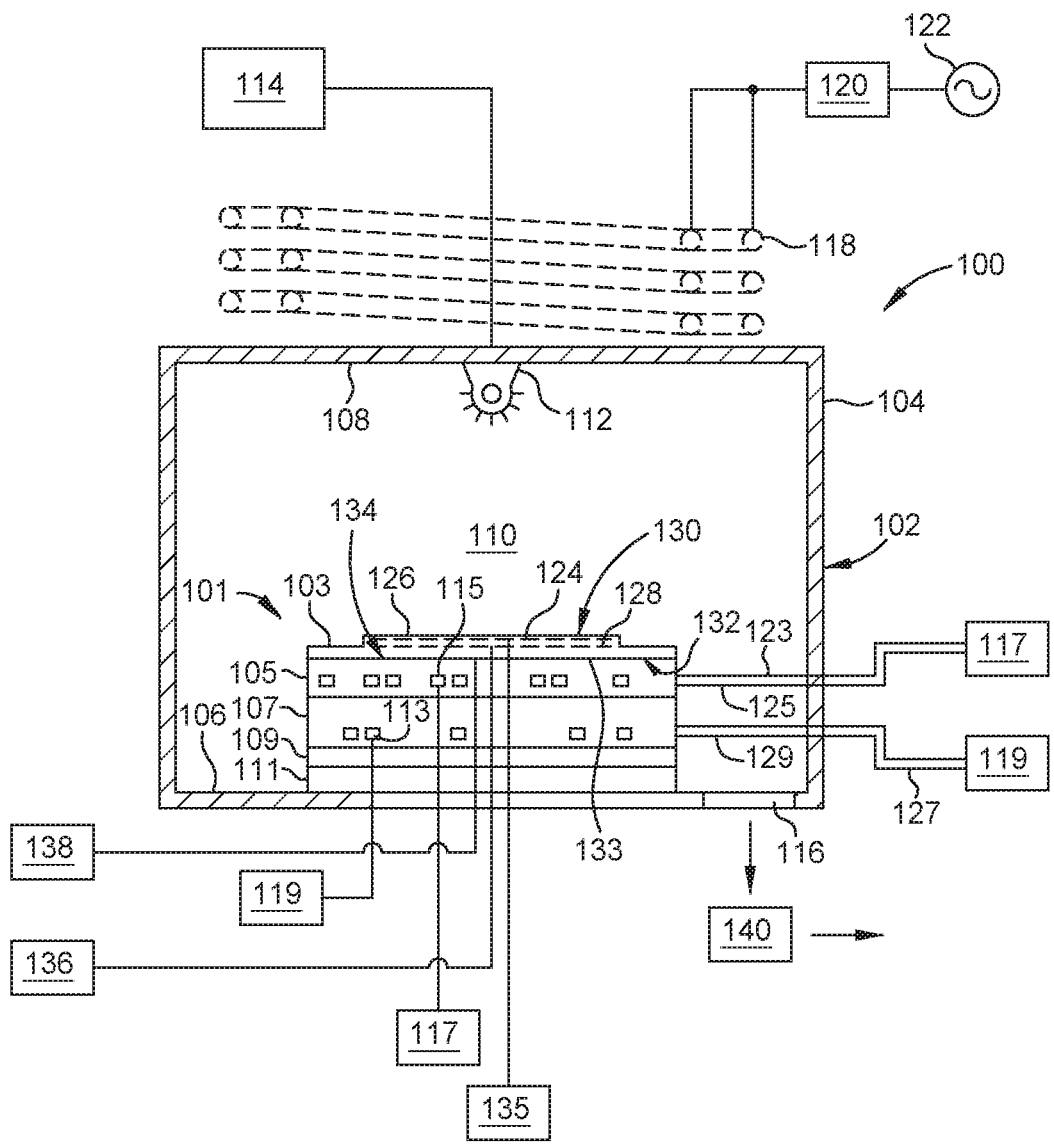
FIG. 1 is a cross-sectional schematic view of an exemplary plasma processing chamber according to an embodiment.

FIG. 1 is a cross-sectional schematic view of an exemplary plasma processing chamber 100, shown configured as an etch chamber, having a substrate support assembly 101. As mentioned above, the substrate support assembly 101 may be utilized in other types of plasma processing chambers, for example plasma treatment chambers, annealing chambers, physical vapor deposition chambers, chemical vapor deposition chambers, and ion implantation chambers, among others, as well as other systems where the ability to uniformly maintain a surface of a workpiece, such as a substrate 124, at a cryogenic processing temperature is desirable. Dry reactive ion etching the substrate 124 maintained at a cryogenic processing temperature enables ions to bombard the upward facing surfaces of materials disposed on the substrate 124 with decreased spontaneous etching so that trenches with smooth, vertical sidewalls are formed. For example, diffusion of ions in porosities of a low-k dielectric material disposed on the substrate 124 uniformly maintained at the cryogenic processing temperature is decreased while ions continue to bombard the upward facing surface of the low-k dielectric material to form trenches with smooth, vertical sidewalls. Additionally, selectivity of etching one material versus another can be improved at the cryogenic processing temperature. For example, selectivity between silicon (Si) and silicon dioxide ($SiO_2$) increases exponentially as temperature is decreased.

The plasma processing chamber 100 includes a chamber body 102 having sidewalls 104, a bottom 106 and a lid 108 that enclose a processing region 110. An injection apparatus 112 is coupled to the sidewalls 104 and/or lid 108 of the chamber body 102. A gas panel 114 is coupled to the injection apparatus 112 to allow process gases to be provided into the processing region 110. The injection apparatus 112 may be one or more nozzle or inlet ports, or alternatively a showerhead. Process gases, along with any processing by-products, are removed from the processing region 110 through an exhaust port 116 formed in the sidewalls 104 or bottom 106 of the chamber body 102. The exhaust port 116 is coupled to a pumping system 140, which includes throttle valves and pumps utilized to control the vacuum levels within the processing region 110. Processing by-products are also removed through the exhaust port 116 using the pumping system 140.

The process gases may be energized to form a plasma within the processing region 110. The process gases may be energized by capacitively or inductively coupling RF power to the process gases. In one embodiment, which can be combined with other embodiments described herein, depicted in FIG. 1, a plurality of coils 118 are disposed above the lid 108 of the plasma processing chamber 100 and coupled through a matching circuit 120 to an RF power source 122.

The substrate support assembly 101 is disposed in the processing region 110 below the injection apparatus 112. The substrate support assembly 101 includes an electrostatic chuck (ESC) 103 and an ESC base assembly 105. The ESC base assembly 105 is coupled to the ESC 103 and a facility plate 107. The facility plate 107, supported by a ground plate 111, is configured to facilitate electrical, cooling, heating, and gas connections with the substrate support assembly 101. The ground plate 111 is supported by the bottom 106 of the processing chamber. A dielectric plate 109 electrically insulates the facility plate 107 from the ground plate 111.

The ESC base assembly 105 includes a base channel 115 fluidly coupled to a cryogenic chiller 117. The cryogenic chiller 117 provides a base fluid, such as a refrigerant, to the base channel 115 so that the ESC base assembly 105, and consequently, the substrate 124, may be maintained at a predetermined cryogenic temperature. Similarly, the facility plate 107 includes a facility channel 113 (further detailed in FIG. 2) fluidly coupled to a chiller 119. The chiller 119 provides facility fluid to the facility channel 113 so that the facility plate 107 is maintained a predetermined temperature. In one example, the base fluid maintains the ESC base assembly 105 at a temperature lower than a temperature of the facility plate 107.

The ESC 103 has a support surface 130 and a bottom surface 132 opposite the support surface 130. In one embodiment, which can be combined with other embodiments described herein, the ESC 103 is fabricated from a ceramic material, such as alumina ($Al_2O_3$), aluminum nitride (AlN) or other suitable material. Alternatively, the ESC 103 may be fabricated from a polymer, such as polyimide, polyetheretherketone, polyaryletherketone and the like.

A bond layer 133 is provided at an interface between the bottom surface 132 of the ESC 103 and a top surface 134 of the ESC base assembly 105. The ESC 103 and ESC base assembly 105 are selected from materials having a coefficient of thermal expansion (CTE) that is substantially similar. The ESC 103 may be made of alumina ($Al_2O_3$) or aluminum nitride (AlN). The ESC base assembly 105 may be made of aluminum (Al), molybdenum (Mo), a ceramic, or combinations thereof. Example materials of the bond layer 133 include indium (In), Al, silicone (containing Si), a perfluoropolymer or combinations and alloys thereof. In one application, an alloy of Mo and Al (about 5-40% aluminum) with a CTE with aluminum oxide ESC is used for the ESC base assembly 105. The bond layer 133 allows strain to be absorbed due to small differences in the CTE of the ESC 103 and ESC base assembly 105 from temperatures of about 90 degrees Celsius to about −200 degrees Celsius during operation. The bond layer 133 can be mixed with ceramic powder to improve thermal conductivity which provides improved heat transfer from the ESC 103 and ESC base assembly 105 via conduction, which enhances operation of the ESC 103.

The ESC 103 includes a chucking electrode 126 disposed therein. The chucking electrode 126 may be configured as a mono polar or bipolar electrode, or other suitable arrangement. The chucking electrode 126 is coupled through an RF filter and the facility plate 107 to a chucking power source 135, which provides a DC power to electrostatically secure the substrate 124 to the support surface 130 of the ESC 103. The RF filter prevents RF power utilized to form a plasma (not shown) within the plasma processing chamber 100 from damaging electrical equipment or presenting an electrical hazard outside the chamber.

The ESC 103 includes one or more resistive heaters 128 embedded therein.

The resistive heaters 128 are utilized to control the temperature of the ESC 103, which is cooled by the ESC base assembly 105, such that cryogenic processing temperatures suitable for processing a substrate 124 disposed on the support surface 130 of the substrate support assembly 101 may be maintained. The resistive heaters 128 are coupled through the facility plate 107 and an RF filter to a heater power source 136. The RF filter prevents RF power utilized to form a plasma (not shown) within the plasma processing chamber 100 from damaging electrical equipment or presenting an electrical hazard outside the chamber. The heater power source 136 may provide 500 watts or more power to the resistive heaters 128. The heater power source 136 includes a controller (not shown) utilized to control the operation of the heater power source 136, which is generally set to heat the substrate 124 to a predetermined cryogenic temperature. In one embodiment, which can be combined with other embodiments described herein, the resistive heaters 128 include a plurality of laterally separated heating zones, wherein the controller enables at least one zone of the resistive heaters 128 to be preferentially heated relative to the resistive heaters 128 located in one or more of the other zones. For example, the resistive heaters 128 may be arranged concentrically in a plurality of separated heating zones. The resistive heaters 128 maintain the substrate 124 at a cryogenic processing temperature suitable for processing. In one embodiment, which can be combined with other embodiments described herein, the cryogenic processing temperature is less than about −10 degrees Celsius. For example, the cryogenic processing temperature is between about −10 degrees Celsius to about −150 degrees Celsius, including down to about −200 degrees Celsius.

The cryogenic chiller 117 is in fluid communication with the base channel 115 via a base inlet conduit 123 connected to an inlet 254 (FIG. 2) of the base channel 115 and via a base outlet conduit 125 connected to an outlet 256 (FIG. 2) of the base channel 115 such that the ESC base assembly 105 is maintained at a predetermined cryogenic temperature. In one embodiment, which can be combined with other embodiments described herein, the cryogenic chiller 117 is coupled to an interface box to control temperature of a base fluid. The base fluid comprises a composition that remains a liquid a cryogenic temperature less than −50 degrees Celsius at operating pressures. The base fluid is generally dielectric or electrically insulative so that an electrical path is not formed through the base fluid when circulated through the substrate support assembly 101. A non-limiting example of suitable base fluid includes fluorinated heat transfer fluids. The cryogenic chiller 117 provides the base fluid, which is circulated through the base channel 115 of the ESC base assembly 105. The base fluid flowing through the base channel 115 enables the ESC base assembly 105 to be maintained at the cryogenic temperature, which assists in controlling the lateral temperature profile of the ESC 103 so that the substrate 124 disposed on the ESC 103 is uniformly maintained at the cryogenic processing temperature. In one embodiment, which can be combined in other embodiments described herein, the cryogenic chiller 117 is a single-stage chiller operable to maintain the cryogenic temperature less than about −50 degrees Celsius. In another embodiment, which can be combined in other embodiments described herein, the cryogenic chiller 117 is a two-stage chiller that utilizes refrigerant internal to the two-stage chiller such the base fluid is maintained at the cryogenic temperature less than −50 degrees Celsius.

The chiller 119 is in fluid communication with the facility channel 113 via a facility inlet conduit 127 connected to an inlet 240 (FIG. 2) of the facility channel 113 and via a facility outlet conduit 129 connected to an outlet 242 (FIG. 2) of the facility channel 113 such that the facility plate 107 is maintained at a predetermined ambient temperature. In one embodiment, which can be combined with other embodiments described herein, the chiller 119 is coupled to an interface box to control temperature of the facility fluid. The facility fluid may include a material that can maintain an ambient temperature between about −10 degrees Celsius to about 60 degrees Celsius. The chiller 119 provides the facility fluid, which is circulated through the facility channel 113 of the facility plate 107. The facility fluid is generally dielectric or electrically insulative so that an electrical path is not formed through the facility fluid when circulated through the substrate support assembly 101. A non-limiting example of a suitable facility fluid includes fluorinated heat transfer fluids. The facility fluid flowing through the facility channel 113 enables the facility plate 107 to be maintained at the predetermined ambient temperature, which assists in maintaining the dielectric plate 109 at the predetermined ambient temperature.

Figure 2:
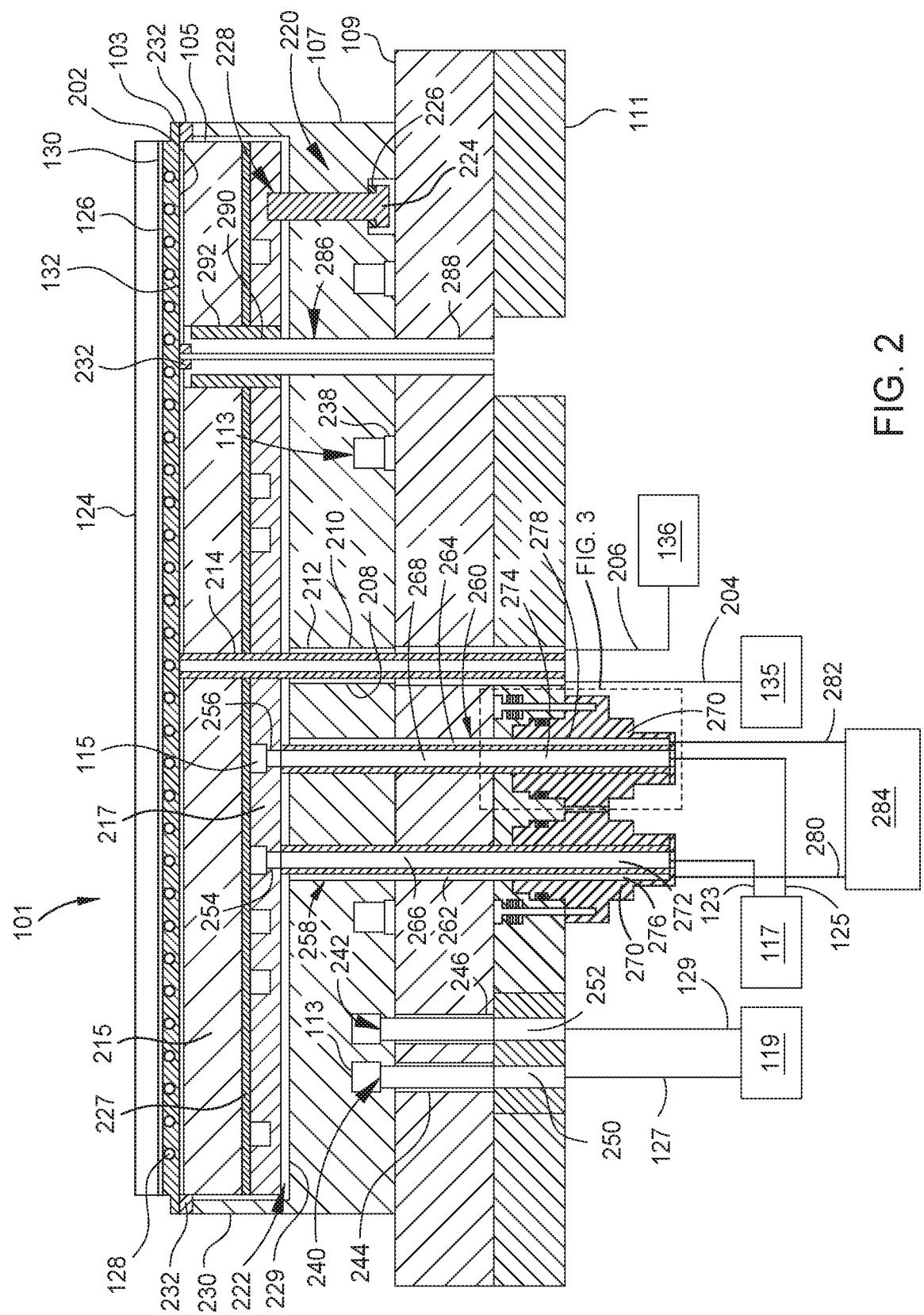
FIG. 2 is a schematic sectional view of an exemplary substrate support assembly according to an embodiment.

FIG. 2 is a schematic sectional view of an exemplary substrate support assembly 101 according to an embodiment. The substrate support assembly 101 is configured to enable cryogenic temperature operation of ESC 103 so that the substrate 124 disposed thereon is maintained at the cryogenic processing temperature. The ESC 103 is coupled to the ESC base assembly 105. The chucking electrode 126 is coupled to the chucking power source 135 via a first insulated wire 204 disposed through a first bore 208 in a lower insulator 212 of the facility plate 107 and an upper insulator 214 of the ESC base assembly 105. The one or more resistive heaters 128 are coupled to the heater power source 136 via a second insulated wire 206 disposed through a second bore 210 in the lower insulator 212 of the facility plate 107 and the upper insulator 214 of the ESC base assembly 105. In some embodiments, the ESC base assembly 105 includes an upper plate 215 and a lower plate 217. A thermal break 227 is provided between the upper plate 215 and the lower plate 217. The upper plate 215 may be made from Mo while the lower plate 217 is Al. In one embodiment, which can be combined with other embodiments described herein, the thermal break 227 includes a polyamide-imide (PAI) or polyimide (PI) containing material.

The facility plate 107 includes a plate portion 229 and wall portion 230. The plate portion 229 of the facility plate 107 is coupled to the ESC base assembly 105 with one or more first screw assemblies 220 so that a vacuum region 222 is present between the ESC base assembly 105 and the facility plate 107. Each of the one or more first screw assemblies 220 includes a bolt 224 contacting the facility plate 107 via a biasing element 226, and inserted into a threaded hole 228 of ESC base assembly 105.

The biasing element 226 is utilized to generate a force when compressed. Suitable biasing elements 226 includes coil springs, spring forms, and elastomers. In one example, the biasing element 226 is a plurality of Belleville washers. The biasing element 226 is compressed by tightening the bolt 224, so that the facility plate 107 is forced (i.e., pre-loaded) against the ESC base assembly 105.

In operation, the ESC base assembly 105 is generally maintained in an RF hot condition. The facility plate 107 includes the wall portion 230 and is coupled to the ESC 103 by a seal 232. In one embodiment, which can be combined with other embodiments described herein, the lower insulator 212 of the facility plate 107 maintains the vacuum region 222 via the seal 232. The wall portion 230, coupled to the ESC 103 by the seal 232, protects the materials of the ESC base assembly 105 from potential corrosion and/or erosion from contact with process gases.

The vacuum region 222 is defined by the ESC 103, ESC base assembly 105, facility plate 107, and seal 232. The vacuum region 222 prevents condensation on the backside of the cooled ESC 103, prevents process gases from entering the substrate support assembly 101 by having a pressure independent of the pressure of the processing region 110 (shown in FIG. 1), and provides for thermal isolation between the ESC base assembly 105 and facility plate 107. In one embodiment, which can be combined with other embodiments described herein, the facility plate 107 includes aluminum containing materials.

The facility channel 113 of the facility plate 107 is machined in the facility plate and sealed with a cover 238. In one example, the cover 238 is welded to the facility plate 107 to seal the facility channel 113. The inlet 240 of the facility channel 113 is in fluid communication with an inlet conduit 244 disposed through the dielectric plate 109 and the ground plate 111. The outlet 242 of the facility channel 113 is in fluid communication with an outlet conduit 246 disposed through the dielectric plate 109 and the ground plate 111. The inlet conduit 244 and outlet conduit 246 have a connection inlet 250 connected to the facility inlet conduit 127 and a connection outlet 252 connected to the facility outlet conduit 129. In operation, the facility plate 107 is generally maintained in an RF hot condition.

The base channel 115 of the ESC base assembly 105 includes the inlet 254 in fluid communication with an inlet conduit 258 disposed through the facility plate 107, the dielectric plate 109, and the ground plate 111. The outlet 256 of the base channel 115 is in fluid communication with an outlet conduit 260 disposed through the facility plate 107, the dielectric plate 109, and the ground plate 111. The inlet conduit 258 and the outlet conduit 260 are disposed within the vacuum region 222 of the substrate support assembly 101. The inlet conduit 258 and the outlet conduit 260 are connected to a respective interface block 270. In one embodiment, which can be combined with other embodiments described herein, the interface block 270 is fabricated from stainless steel. The inlet conduit 258 includes a fluid inlet conduit 266 and a vacuum channel 262. The jacketed outlet conduit 260 includes a fluid outlet conduit 268 and a vacuum channel 264. The interface block 270 is described in more detail in FIG. 3.

The inlet conduit 258 and the outlet conduit 260 include a base inlet 272, a vacuum channel 276, a base outlet 274, and a vacuum channel 278. The base inlet 272 connects the fluid inlet conduit 266 to the base inlet conduit 123. The base outlet 274 connects the fluid outlet conduit 268 to the base outlet conduit 125. The vacuum channel 276 is connected to a vacuum conduit 280 in fluid communication with a vacuum source 284, and the vacuum channel 278 is connected to a vacuum conduit 282 in fluid communication with the vacuum source 284. Both the vacuum channel 276 and the vacuum channel 278 are in fluid communication with the vacuum region 222. Coupling the vacuum source 284 to the vacuum region 222 enables a pressure independent of the pressure of the processing region 110 to be maintained in the vacuum region 222. In one embodiment, which can be combined with other embodiments described herein, the fluid inlet conduit 266 and the fluid outlet conduit 268 are coupled to the ESC base assembly 105 by the seal 232 to maintain the pressure in the vacuum region 222.

The substrate support assembly 101 also includes one or more lift pin assemblies 286 for accommodating lift pins (not shown) for elevating the substrate 124 above the support surface 130 of the ESC 103 to facilitate robotic transfer into and out of the plasma processing chamber 100. Each of the one or more lift pin assemblies 286 includes a lift pin guide 288 disposed through the ESC 103, the ESC base assembly 105, the facility plate 107, the dielectric plate 109, and the ground plate 111. A portion 290 of the lift pin guide 288 disposed through the ESC base assembly 105 is surrounded by a threaded bushing 292 holding the lift pin guide 288 in position. The lift pin guide 288 is coupled to the ESC 103 by the seal 232 to maintain the chamber vacuum and insulation. In one embodiment, which can be combined with other embodiments described herein, the ESC 103 includes one or more gas passages (not shown) for providing backside heat transfer gas, such as helium, to a backside of the substrate 124 and the support surface 130 of the ESC 103.

Figure 3:
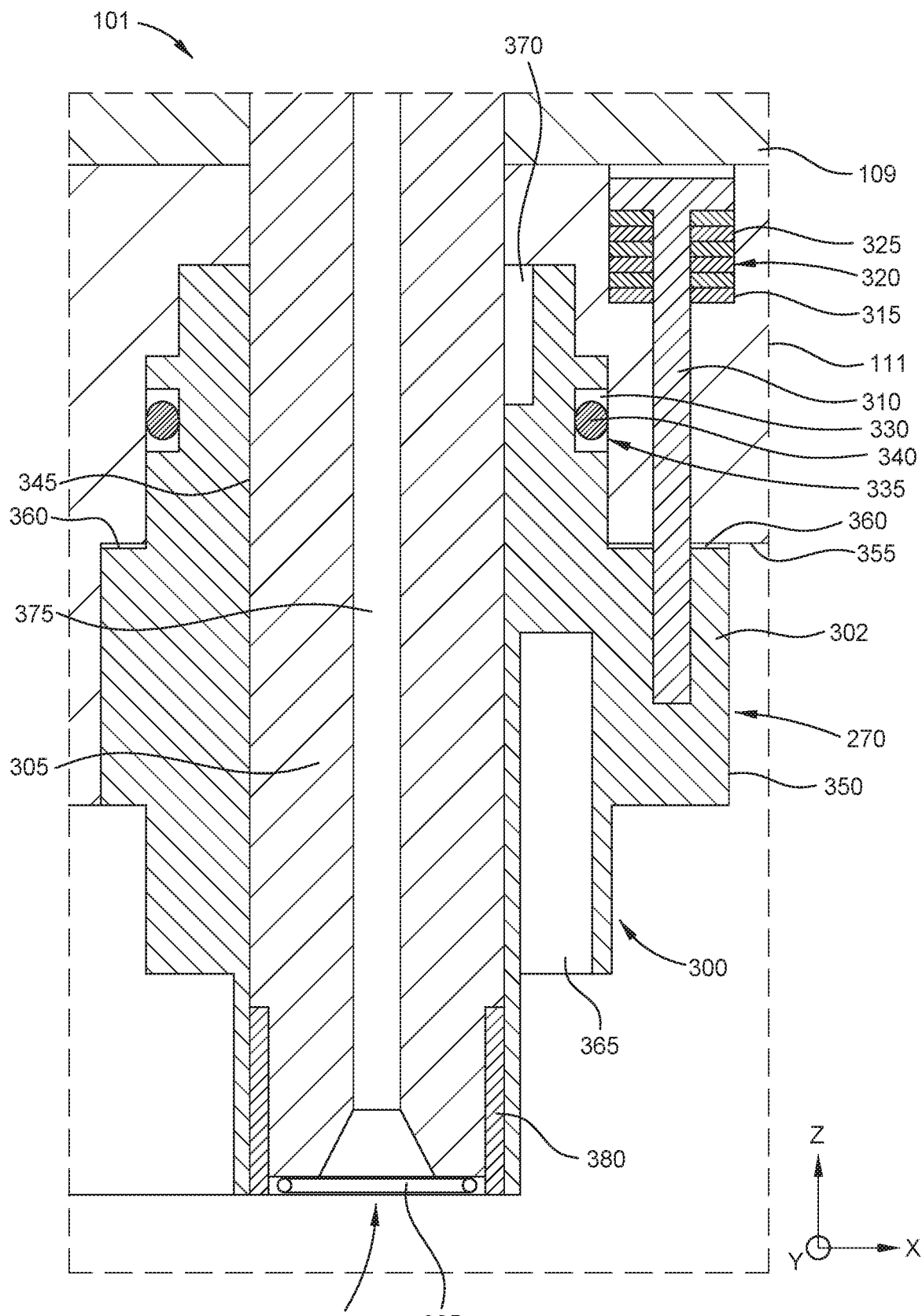
FIG. 3 is a sectional view of a portion of the substrate support assembly of FIG. 2.

FIG. 3 is a sectional view of a portion of the substrate support assembly 101 of FIG. 2. The interface block 270 includes a connector 300 that facilitates coupling of the fluid outlet conduit 268 to the substrate support assembly 101. In particular, the connector 300 couples a tubular member 305 of the fluid outlet conduit 268 to the ground plate 111. While not shown or described in detail, the fluid inlet conduit 266 includes a dedicated interface connection (i.e., the interface block 270), connector (i.e., the connector 300) and a tubular member (i.e., the tubular member 305) as described in FIG. 3.

The connector 300 includes a body 302 that is coupled to the ground plate 111 by at least one fastener 310, such as screw or bolt. In the sectional view of FIG. 3, only one fastener is shown, but up to about three fasteners are utilized to couple the connector 300 to the ground plate 111. A portion of the ground plate 111 includes a pocket 315 formed therein. In the sectional view of FIG. 3, only one pocket is shown, but the number of pockets is equal to the number of fasteners utilized with the connector 300. A biasing assembly 320 that is coupled to the fastener 310 is positioned in the pocket 315. The biasing assembly 320 includes a plurality of spring forms 325 that are biased against each other as well as the fastener 310 and the pocket 315. Each of the spring forms 325 compress and expand based on temperatures of the substrate support assembly 101. For example, when refrigerant is provided to the substrate support assembly 101 (e.g., when the substrate support assembly 101 is chilled), the spring forms 325 expand. When the substrate support assembly 101 is not chilled, the spring forms 325 compress. Thus, the biasing assembly 320 (one or a combination of the connector 300, the spring forms 325 and the pocket 315) allows at least vertical (Z direction) movement of the connector 300 relative to the ground plate 111 during use. Each of the spring forms 325 may be a disc-spring washer, such as a Belleville washer.

The connector 300 also includes an annular pocket 330 that defines a portion of a dynamic or sliding seal 335. The sliding seal 335 also includes an elastomeric seal 340, such as an O-ring. The sliding seal 335 allows vertical movement of the connector 300 relative to the ground plate 111 during use and maintains vacuum or negative pressures from ambient or atmospheric pressures. For example, a gap 345, formed between an outer surface of the tubular member 305 and portions of the connector 300, the dielectric plate 109 and the ground plate 111 along the length of the tubular member 305, is maintained at vacuum pressures during use of the substrate support assembly 101. In contrast, outer surfaces 350 of the connector 300 are in fluid communication with ambient or atmospheric conditions. Thus, the sliding seal 335 comprises a hermetic seal that maintains the pressures within and without the connector 300. Additionally, during use, the temperature of the substrate support assembly 101 near the sliding seal 335 is at or near room temperatures, which prevents degradation of the elastomeric seal 340.

The connector 300 is also coupled to a lower surface 355 of the ground plate 111 by a thermal gasket 360. The thermal gasket 360 is a thermally conductive gel material in the form of a pad. The thermal gasket 360 comprises a silicone material. The connector 300 also includes one or more first or lower channels 365 and one or more second or upper channels 370. While only one of the lower channels 365 and one of the upper channels 370 is shown in the sectional view of FIG. 3, the connector 300 can have three, four, or more of each of the lower channels 365 and the upper channels 370. As will be explained in more detail below, the lower channels 365 and the upper channels 370 allow vacuum pumping around the tubular member 305. For example, negative pressures can be provided through the gap 345 facilitated by pumping through the lower channels 365 and the upper channels 370.

The tubular member 305 includes a channel 375 formed along a length thereof for flowing the refrigerant to the cryogenic chiller 117. The tubular member 305 also includes an end guide 380 as well as a spring seal 385. As will be explained below in FIG. 5, the tubular member 305 includes the end guide 380 and the spring seal 385 at both ends thereof. As will be explained in greater detail in FIG. 6, the end guide 380 holds the spring seal 385 in position and/or limits compression of the spring seal 385. Ends of the end guide 380 also prevent tilting of the tubular member 305 due to radial expansion and contraction of the substrate support assembly 101. For example, the end guide 380 allows the tubular member 305 to move laterally in the X/Y plane (during use of the substrate support assembly 101 (e.g., radial expansion and contraction)). The end guide 380 also allows vacuum pumping while minimizing arcing at the interface of the tubular member 305 with the connector 300 and the ESC 103.

Figure 4:
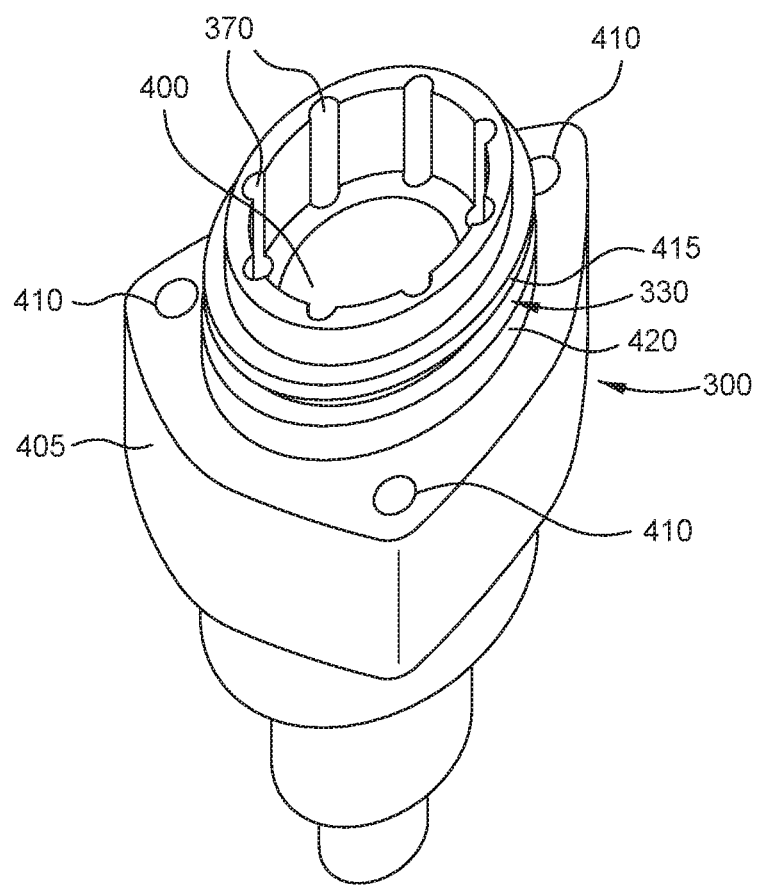
FIG. 4 is an isometric view of a connector as disclosed herein.

FIG. 4 is an isometric view of the connector 300 as disclosed herein. The connector 300 includes a central opening 400 sized to receive the tubular member 305 (shown in FIG. 3). Additionally, the connector 300 also includes a flange 405. The flange 405 includes a plurality of through-holes 410 each adapted to receive a fastener 310 (shown in FIG. 3). The connector 300 also includes a first or upper shoulder 415 and a second or lower shoulder 420. The annular pocket 330 (shown in FIG. 3) is defined between the upper shoulder 415 and the lower shoulder 420.

Figure 5:
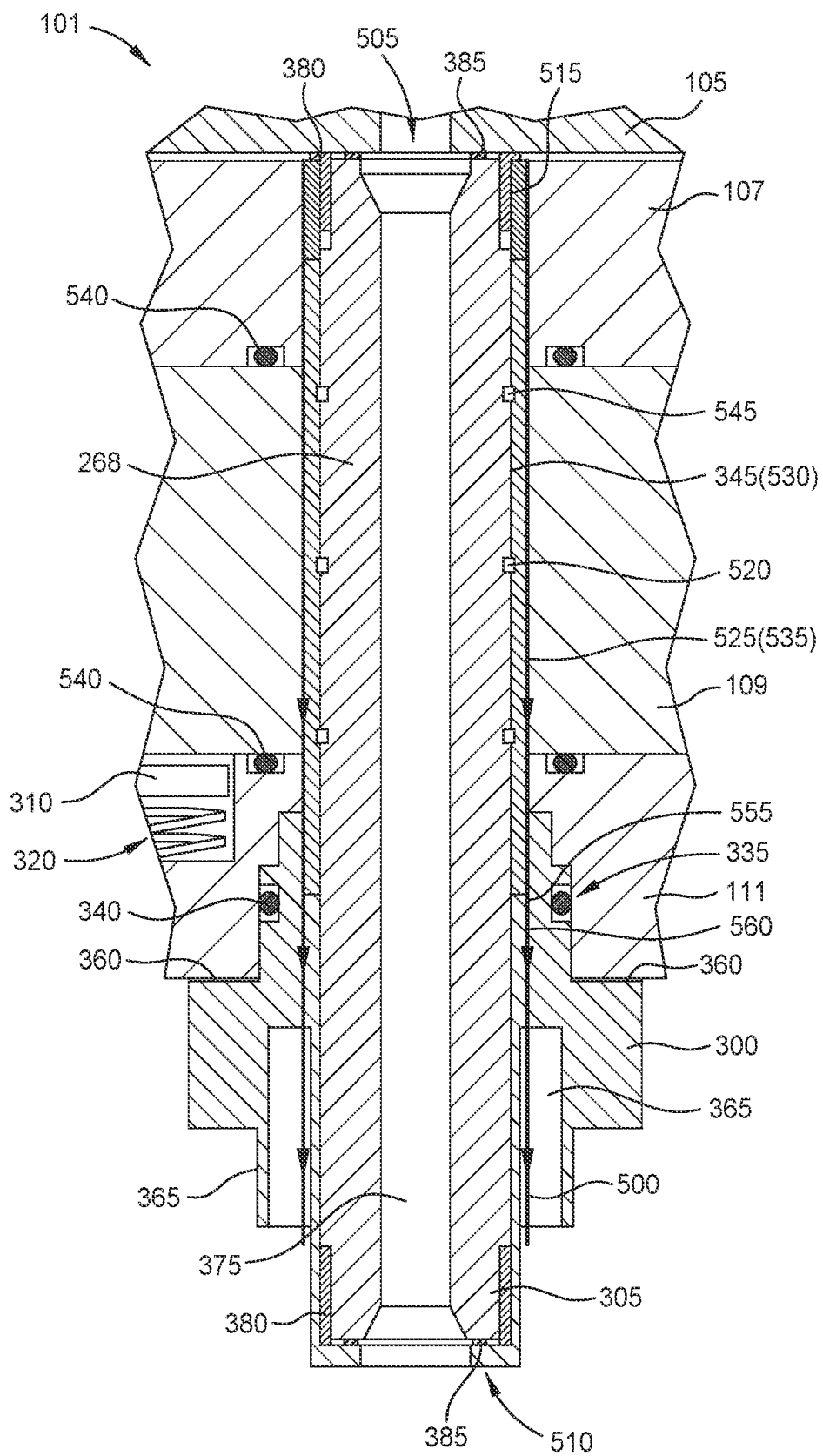
FIG. 5 is a schematic sectional view showing one embodiment of a vacuum path through the substrate support assembly as described herein.

FIG. 5 is a schematic sectional view showing one embodiment of a vacuum path 500 through the substrate support assembly 101. The vacuum path 500 is shown by arrows in FIG. 5. The vacuum path 500 is a conductance path from a first end 505 of the tubular member 305 to a second end 510 of the tubular member 305. The conductance path includes flow through interstitial spaces 515 in or around the end guide 380 to the gap 345. In some embodiments, a portion of the outer surface of the tubular member 305 includes a sleeve 520. The sleeve 520 includes a gap 525 formed between an outer surface thereof, and the ESC base assembly 105, the dielectric plate 109, and the ground plate 111.

In some embodiments, the gap 345 is a first or inner channel 530 and the gap 525 is a second or outer channel 535. Seals 540, such as O-rings, as well as the sliding seal 335, seal the conductance path through the various layers the tubular member 305 extends through.

In some embodiments, the inner channel 530 comprises a helical or spiral channel 545 that includes a portion formed in the outer surface of the tubular member 305 and an inner surface of the sleeve 520.

The conductance path also flows through ports 555 formed in the sleeve 520 that are in fluid communication with the inner channel 530 and/or the outer channel 535. The conductance path also extends into the connector 300 via a plurality of longitudinal channels 560 that are in fluid communication with the lower channels 365 of the connector 300.

Figure 7:
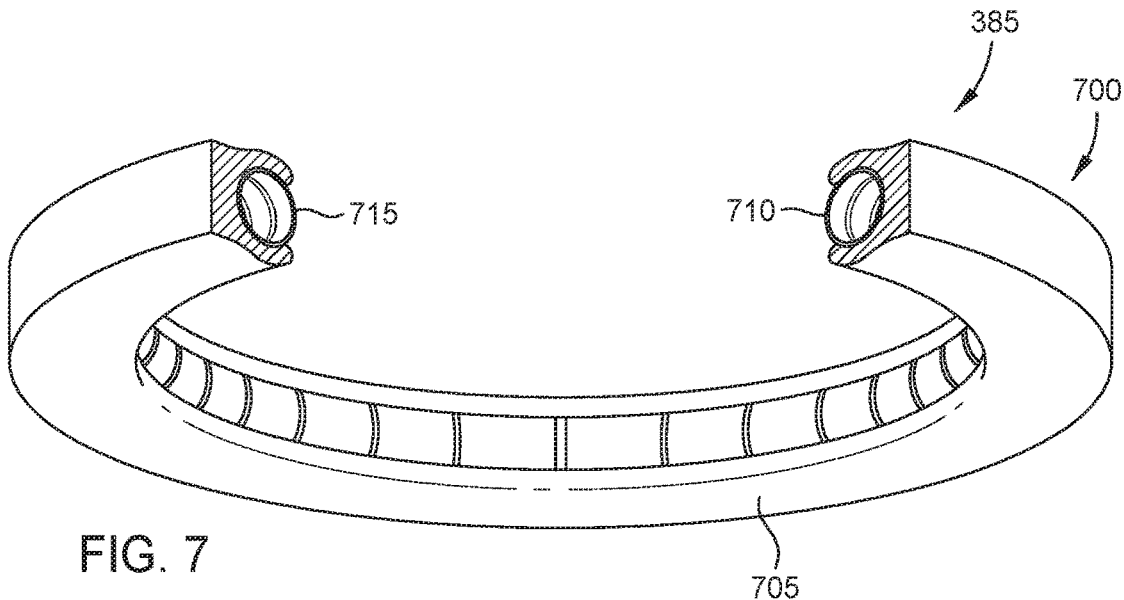
FIG. 7 is a partial isometric view of one embodiment of a spring seal.

As shown in FIG. 5, both of the first end 505 and the second end 510 include a spring seal 385. The spring seals 385 comprise a coil spring made of a metallic material, such as stainless steel encased in a soft plastic. An example of the spring seal 385 is shown in FIG. 7. Also shown in FIG. 5, both of the first end 505 and the second end 510 of the tubular member 305 include an end guide 380.

Figure 6A:
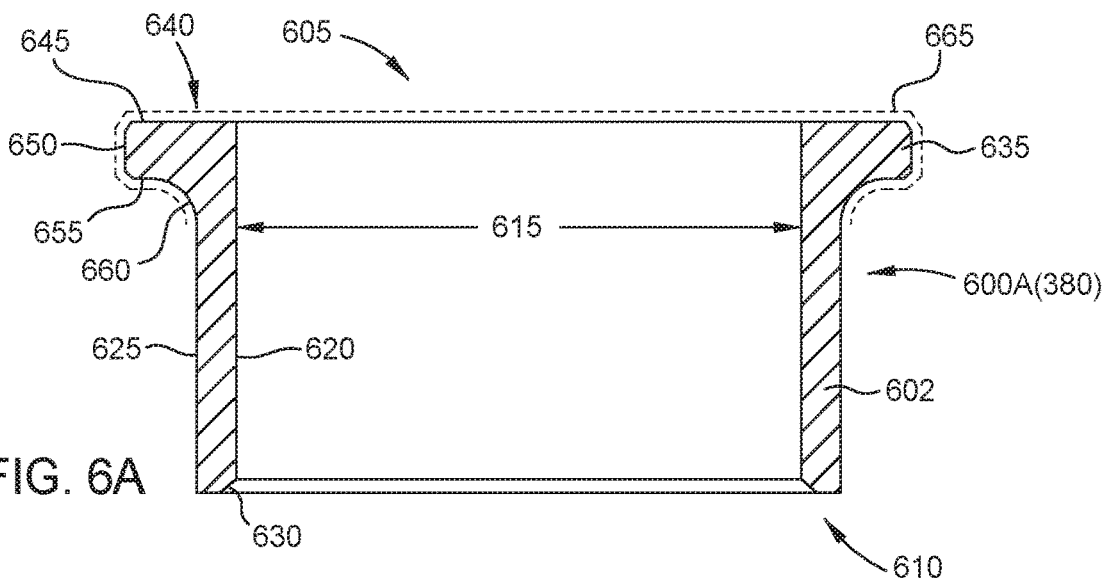
FIGS. 6A and 6B are sectional views of an upper end guide and a lower end guide, respectively, that may be used as the end guides with the tubular member as described in FIGS. 3 and 5.
Figure 6B:
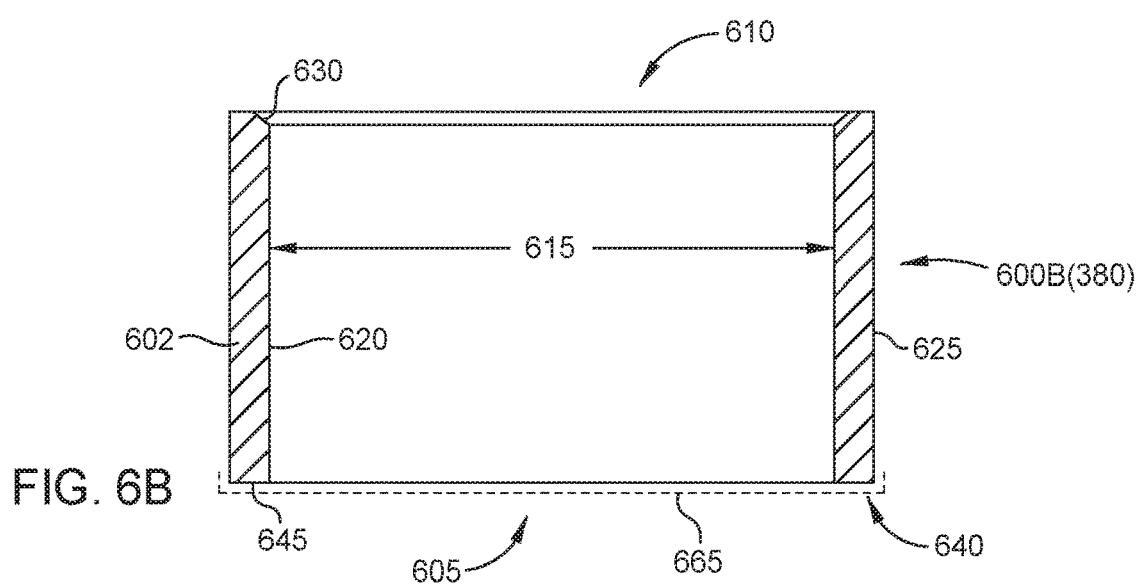

FIGS. 6A and 6B are sectional views of an upper end guide 600A and a lower end guide 600B, respectively. The upper end guide 600A and the lower end guide 600B may be used as the end guides 380 with the tubular member 305 as described in FIGS. 3 and 5.

The upper end guide 600A and the lower end guide 600B include a tubular body 602 made of a metallic material, such as stainless steel. The tubular body 602 includes a first end 605 and a second end 610 opposing the first end 605. The tubular body 602 includes an inside diameter 615 sized to receive the first end 505 of the tubular member 305 or a second end 510 of the tubular member 305 (shown in FIG. 5). The tubular body 600 includes an interior wall 620 and an exterior wall 625. A taper 630 is shown at an interface between the second end 610 and the interior wall 620.

The tubular body 602 of the upper end guide 600A includes a flange 635 at the first end 605 thereof. The flange 635 extends radially outward from the exterior wall 625. The flange 635 includes a first surface 645, a side surface 650, and a second surface 655. The first surface 645 is generally orthogonal to a plane of the interior wall 620 or the exterior wall 625. The side surface 650 is generally parallel to a plane of the interior wall 620 or the exterior wall 625. The second surface 655 is generally parallel to the first surface 645. An interface 660 transitions the second surface 655 to the exterior wall 625.

The first surface 645 of the upper end guide 600A includes a contact surface 640 that is adapted to contact the ESC base assembly 105 (on one end of the tubular member 305) and the connector 300 (at the other end of the tubular member 305). Similar to upper end guide 600A, the lower end guide 600B includes a first surface 645. The contact surface 640 includes a coating 665. The coating 665 is a polymeric material, such as a fluoropolymer, including but not limited to perfluoroalkoxy alkane (PFA) based materials.

FIG. 7 is a schematic partial isometric view of one embodiment of the spring seal 385. The spring seal 385 includes a seal assembly 700. The seal assembly 700 includes a polymer body 705 having a spring 710 disposed in a channel 715 thereof. While FIG. 7 shows the seal assembly 700 as a face seal, embodiments described herein may include piston (i.e., radial) seals having a polytetrafluoroethylene (PTFE) as the polymer body 705 or metal seals. The seals described herein provide for sealing of the vacuum region 222 at a temperature between about −260 degrees Celsius to about 290 degrees Celsius. In one embodiment, which can be combined with other embodiments described herein, the spring 710 includes stainless steel, nickel alloy, nickel-chromium alloy, and cobalt-chromium-nickel-molybdenum alloy containing materials. The seal assembly 700 allows for sealing of the ESC 103 at cryogenic temperatures. The seal assembly 700 is operable at a temperature between about −260 degrees Celsius to about 290 degrees Celsius.

The end guide 380 as described herein provides flow for the vacuum path 500 as described in FIG. 5. The end guide 380 prevents over-compression of the spring seal 385 (in the longitudinal (length) direction of the tubular member 305) but allows for limited lateral movement of the tubular member 305. However, radial expansion and contraction of the substrate support assembly 101 due to temperature changes during use will cause the tubular member 305 to tilt or bind. The titling or binding may cause a refrigerant fluid leak. However, the coating 665 is utilized to reduce friction between mating surfaces of the ESC base assembly 105 and the tubular member 305 with the end guide 380 positioned thereon. Thus, the coating 665 allows the tubular member 305 to slide relative to these mating surfaces during use when the substrate support assembly 101 is expanding or contracting. In addition, the coating 665 is dielectric, which minimizes or eliminates arcing in or along the vacuum path 500.

While the foregoing is directed to examples of the present disclosure, other and further examples of the disclosure may be devised without departing from the basic scope thereof, and the scope thereof is determined by the claims that follow.

What is claimed is:

1. A substrate support assembly comprising:
    a body comprising:
        an electrostatic chuck base assembly having channels configured to be fluidly coupled to a cryogenic chiller;
        a facility plate disposed below the electrostatic chuck base assembly; and
    a ground plate coupled a bottom surface of to the facility plate;
    a tubular member having a fluid conduit disposed therethrough, the tubular member disposed through the facility plate and the ground plate and fluidly coupled to the electrostatic chuck base assembly, the tubular member having a first end guide and a spring seal disposed at a first end that extends beyond a bottom surface of the ground plate, the first end guide disposed around the tubular member and extending beyond the first end of the tubular member, and the tubular member having a second end guide disposed at a second end of the fluid conduit, wherein the second end guide is in contact with the electrostatic chuck base assembly and includes a friction reducing coating disposed thereon; and
    a connector physically coupled to the bottom surface of the ground plate, the connector housing a portion of the tubular member, the first end guide and spring seal disposed below the bottom surface of the ground plate and in the connector, the first end guide contacting the tubular member and the connector in a manner that restricts axial compression of the spring seal, the spring seal providing an axial seal between the spring seal and the connector.

2. The substrate support assembly of claim 1 further comprising:
    a biasing assembly and a fastener disposed in a pocket formed in the ground plate, wherein the biasing assembly comprises a plurality of spring forms coupled between the fastener and the pocket.

3. The substrate support assembly of claim 1, wherein the connector includes a sliding seal surrounding a body of the connector.

4. The substrate support assembly of claim 1, wherein the connector includes one or more vacuum channels formed therein.

5. The substrate support assembly of claim 1, further comprising an electrostatic chuck disposed on the electrostatic chuck base assembly, wherein the electrostatic chuck has an RF electrode.

6. The substrate support assembly of claim 5, further comprising a bond layer at an interface between a bottom surface of the electrostatic chuck and a top surface of the electrostatic chuck base assembly.

7. The substrate support assembly of claim 1, wherein the connector is coupled to a lower surface of the ground plate by a thermal gasket.

8. The substrate support assembly of claim 1, wherein the first end guide includes a friction reducing coating disposed thereon.

9. A substrate support assembly comprising:
    a base assembly for supporting an electrostatic chuck;
    a facility plate coupled to the base assembly;
    a dielectric plate coupled to the facility plate;
    a ground plate coupled to the dielectric plate;
    a tubular member having a fluid conduit disposed therethrough, the tubular member disposed through the facility plate and the ground plate, the tubular member having a first end guide and a spring seal disposed at a first end that extends beyond a bottom surface of the ground plate, the first end guide disposed around the tubular member and extending beyond the first end of the tubular member and the tubular member having a second end guide disposed at a second end of the fluid conduit, wherein the second end guide is in contact with the electrostatic chuck base assembly and includes a friction reducing coating disposed thereon; and
    a connector coupled to a bottom surface of the ground plate, the connector housing a portion of the tubular member, the first end guide and spring seal disposed in the connector below the bottom surface of the ground plate, the first end guide contacting the tubular member and the connector in a manner that restricts axial compression of the spring seal, the spring seal providing an axial seal between the spring seal and the connector, the connector comprising a biasing assembly and a fastener disposed in a pocket formed in the ground plate, and a sliding seal surrounding a body of the connector.

10. The substrate support assembly of claim 9, further comprising a bond layer disposed on a top surface of the base assembly.

11. The substrate support assembly of claim 9, wherein the connector is coupled to a lower surface of the ground plate by a thermal gasket.

12. The substrate support assembly of claim 9, wherein the first end guide includes a friction reducing coating disposed thereon.

13. The substrate support assembly of claim 9, further comprising a sleeve provided around the fluid conduit.

14. The substrate support assembly of claim 13, wherein the sleeve includes a gap formed between an outer surface thereof and the base assembly, the dielectric plate, and the ground plate.

15. A substrate support assembly comprising:
   an electrostatic chuck;
   a base assembly coupled to the electrostatic chuck, the base assembly having base channels configured to flow a cryogenic fluid for cooling the electrostatic chuck;
   a facility plate coupled to the base assembly, the facility plate having facility channel configured to flow a temperature control fluid therethrough;
   a dielectric plate coupled to the facility plate;
   a ground plate coupled to the facility plate;
   a tubular member having a fluid conduit disposed therethrough, the tubular member disposed through the facility plate and the ground plate, the tubular member having a first end guide and a spring seal disposed at a first end that extends beyond a bottom surface of the ground plate and the tubular member having a second end guide disposed at a second end of the fluid conduit, wherein the second end guide is in contact with the electrostatic chuck base assembly and includes a friction reducing coating disposed thereon; and
   a connector coupled to a bottom surface of the ground plate, the connector housing a portion of the tubular member, the first end guide and spring seal disposed in the connector below the bottom surface of the ground plate, the first end guide contacting the tubular member and the connector in a manner that restricts axial compression of the spring seal, the spring seal providing an axial seal between the spring seal and the connector, the connector comprising a biasing assembly and a fastener disposed in a pocket formed in the ground plate, and a sliding seal surrounding a body of the connector.

16. The substrate support assembly of claim 15, further comprising a bond layer disposed on a top surface of the base assembly.

17. The substrate support assembly of claim 15, wherein the connector is coupled to the ground plate by a thermal gasket.

* * * * *